(12) United States Patent
Bachhuber et al.

(10) Patent No.: US 7,773,959 B1
(45) Date of Patent: Aug. 10, 2010

(54) QUADRATURE RADIO FREQUENCY AMPLIFIER OUTPUT NETWORK

(75) Inventors: Stephen P. Bachhuber, Greensboro, NC (US); Derek Schooley, Oak Ridge, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 602 days.

(21) Appl. No.: 11/739,712

(22) Filed: Apr. 25, 2007

(51) Int. Cl.
*H01Q 11/12* (2006.01)
*H04B 1/04* (2006.01)

(52) U.S. Cl. .................. 455/91; 455/127.1; 455/127.3

(58) Field of Classification Search .................. 455/91, 455/114.2–114.3, 126–127.4; 375/297
See application file for complete search history.

(56) References Cited

U.S. PATENT DOCUMENTS

| | | | |
|---|---|---|---|
| 3,371,284 A | 2/1968 | Engelbrecht | |
| 4,814,730 A * | 3/1989 | Via et al. ...................... 333/119 |
| 6,650,180 B2 * | 11/2003 | Lautzenhiser et al. ... 330/124 R |
| 6,696,902 B2 | 2/2004 | Lerke et al. | |
| 7,215,221 B1 * | 5/2007 | Ellis et al. .................... 333/125 |
| 7,242,245 B2 * | 7/2007 | Burns et al. ............. 330/124 R |
| 7,388,433 B1 * | 6/2008 | Hecht ......................... 330/295 |
| 7,414,478 B2 * | 8/2008 | Elmala et al. ................ 330/295 |
| 7,542,740 B1 * | 6/2009 | Granger-Jones .......... 455/127.1 |
| 7,561,854 B2 * | 7/2009 | Manicone .................... 455/83 |
| 7,570,932 B1 * | 8/2009 | Folkmann ................. 455/127.1 |
| 2003/0137363 A1 * | 7/2003 | Bawell et al. ............... 333/118 |
| 2006/0006950 A1 * | 1/2006 | Burns et al. .................. 330/311 |

OTHER PUBLICATIONS

R.E. Fisher, "Broad-Band Twisted-Wire Quadrature Hybrids," IEEE Trans. On MTT., May 1973, pp. 355-357, vol. 21.
M.W. Green et al., "Miniature Multilayer Spiral Inductors for GaAs MMICs," GaAs IC Symposium, Oct. 1989, pp. 303-306.
K Kurokawa, "Design Theory of Balanced Transistor Amplifiers," Bell System Technical Journal, Oct. 1965, pp. 1675-1698, vol. 44, No. 10.

* cited by examiner

*Primary Examiner*—Simon D Nguyen
(74) *Attorney, Agent, or Firm*—Withrow & Terranova, P.L.L.C.

(57) ABSTRACT

The present invention provides a quadrature RF amplifier output network that includes a quadrature RF combiner and impedance transformation circuitry. The output network is coupled between a quadrature RF amplifier and an antenna, or other downstream circuitry to optimize net RF power transfer and improve overall power efficiency. The quadrature RF combiner phase-shifts and combines quadrature RF signals from the quadrature RF amplifier into a single combined RF signal that feeds the impedance transformation circuitry. The impedance transformation circuitry transforms an impedance that is presented to the output of the quadrature RF amplifier output network into a desired quadrature impedance that is presented to the outputs of the quadrature RF amplifier. Termination circuitry is coupled to the quadrature RF combiner to capture improperly phased signals, reflected signals, or imbalanced signals.

22 Claims, 18 Drawing Sheets

QUADRATURE RADIO FREQUENCY AMPLIFIER OUTPUT NETWORK

FIELD OF THE INVENTION

The present invention relates to quadrature radio frequency (RF) amplifiers and associated circuitry.

BACKGROUND OF THE INVENTION

Overall power efficiency is important in RF communications equipment. Higher efficiency designs are smaller, cheaper, and generate less heat than lower efficiency designs. In battery powered RF communications equipment, such as mobile terminals, high overall power efficiency is even more important to maximize battery life and minimize the size and weight of the equipment. An RF power amplifier is one of the highest power consuming devices in a mobile terminal. The RF power amplifier is used in an RF transmitter to provide the RF signal for transmission, which is typically sent to an antenna. To maximize the power efficiency of the RF power amplifier, the input impedance to the antenna circuitry may need to be transformed to present an impedance to the RF power amplifier that optimizes RF power transfer to the antenna.

Mobile terminals, such as cell phones, wireless personal digital assistants, or the like, may be carried by a user during RF communications. An antenna of such a mobile terminal may come into contact with the user's body or other objects, which may significantly change the input impedance to the antenna and its associated circuitry. Such impedance changes may increase the magnitude of reflected signals due to impedance mismatches between the RF power amplifier, the antenna, and the antenna circuitry. The reflected signals may cause variations in the voltage standing wave ratio (VSWR) of the antenna. VSWR changes may reduce the net RF power transferred from the RF power amplifier to the antenna. One approach to reduce the effects of VSWR on net RF power transfer is a quadrature power amplifier.

A quadrature power amplifier has two parallel RF signal paths. One RF signal is phase-shifted 90 degrees from the other RF signal. After the final power amplifier stage, a phase-shift is applied to phase align and combine the two RF signals into a single RF signal. The phase-shifting and combining tends to reduce the impact of reflected signals on net RF power transfer to the antenna. Thus, there is a need for a quadrature power amplifier with a quadrature combiner and an impedance transformation circuit to optimize net RF power transfer to an antenna and improve overall power efficiency.

SUMMARY OF THE INVENTION

The present invention provides a quadrature RF amplifier output network that includes a quadrature RF combiner and impedance transformation circuitry. The output network is coupled between a quadrature RF amplifier and an antenna, or other downstream circuitry, to optimize net RF power transfer and improve overall power efficiency. The quadrature RF combiner phase-shifts and combines quadrature RF signals from the quadrature RF amplifier into a single combined RF signal that feeds the impedance transformation circuitry. The impedance transformation circuitry transforms an impedance that is presented to the output of the quadrature RF amplifier output network into a desired quadrature impedance that is presented to the outputs of the quadrature RF amplifier. Termination circuitry is coupled to the quadrature RF combiner to capture improperly phased signals, reflected signals, or imbalanced signals. The termination circuitry may include a DC blocking element, which may be a capacitive element.

Certain embodiments of the present invention may include direct current (DC) power feeds through RF blocking networks to provide DC power to output transistors in the final stages of the quadrature RF amplifier. The RF blocking networks may include inductive elements. The quadrature RF amplifier may be a quadrature RF power amplifier. The termination circuitry may include an inductive element to compensate for impedance introduced by the DC blocking element. In one embodiment of the present invention, the impedance transformation circuitry includes multiple impedance stages, which may include inductive and capacitive elements. Each impedance transformation stage may include an additional inductive element to remove targeted harmonics of an operating frequency. Some embodiments of the present invention may combine some or all of the elements of the quadrature RF amplifier output network, some or all of the elements of the quadrature RF amplifier, or any combination thereof onto a common semiconductor die or onto multiple semiconductor dies attached to a common substrate.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention provides a quadrature RF amplifier output network that includes a quadrature RF combiner and impedance transformation circuitry. The output network is coupled between a quadrature RF amplifier and an antenna, or other downstream circuitry, to optimize net RF power transfer and improve overall power efficiency. The quadrature RF combiner phase-shifts and combines quadrature RF signals from the quadrature RF amplifier into a single combined RF signal that feeds the impedance transformation circuitry. The impedance transformation circuitry transforms an impedance that is presented to the output of the quadrature RF amplifier output network into a desired quadrature impedance that is presented to the outputs of the quadrature RF amplifier. Termination circuitry is coupled to the quadrature RF combiner to capture improperly phased signals, reflected signals, or imbalanced signals. The termination circuitry may include a DC blocking element, which may be a capacitive element. The termination circuitry may include an inductive element to compensate for impedance introduced by the DC blocking element.

Certain embodiments of the present invention may include direct current (DC) power feeds through RF blocking networks to provide DC power to output transistors in the final stages of the quadrature RF amplifier. The RF blocking networks may include inductive elements. The quadrature RF amplifier may be a quadrature RF power amplifier. In one embodiment of the present invention, the impedance transformation circuitry includes multiple impedance transformation stages, which may include inductive and capacitive elements. Each impedance transformation stage may include an additional inductive element to remove targeted harmonics of an operating frequency. Some embodiments of the present invention may combine some or all of the elements of the quadrature RF amplifier output network, some or all of the elements of the quadrature RF amplifier, or any combination thereof onto a common semiconductor die or onto multiple semiconductor dies attached to a common substrate.

Figure 1:
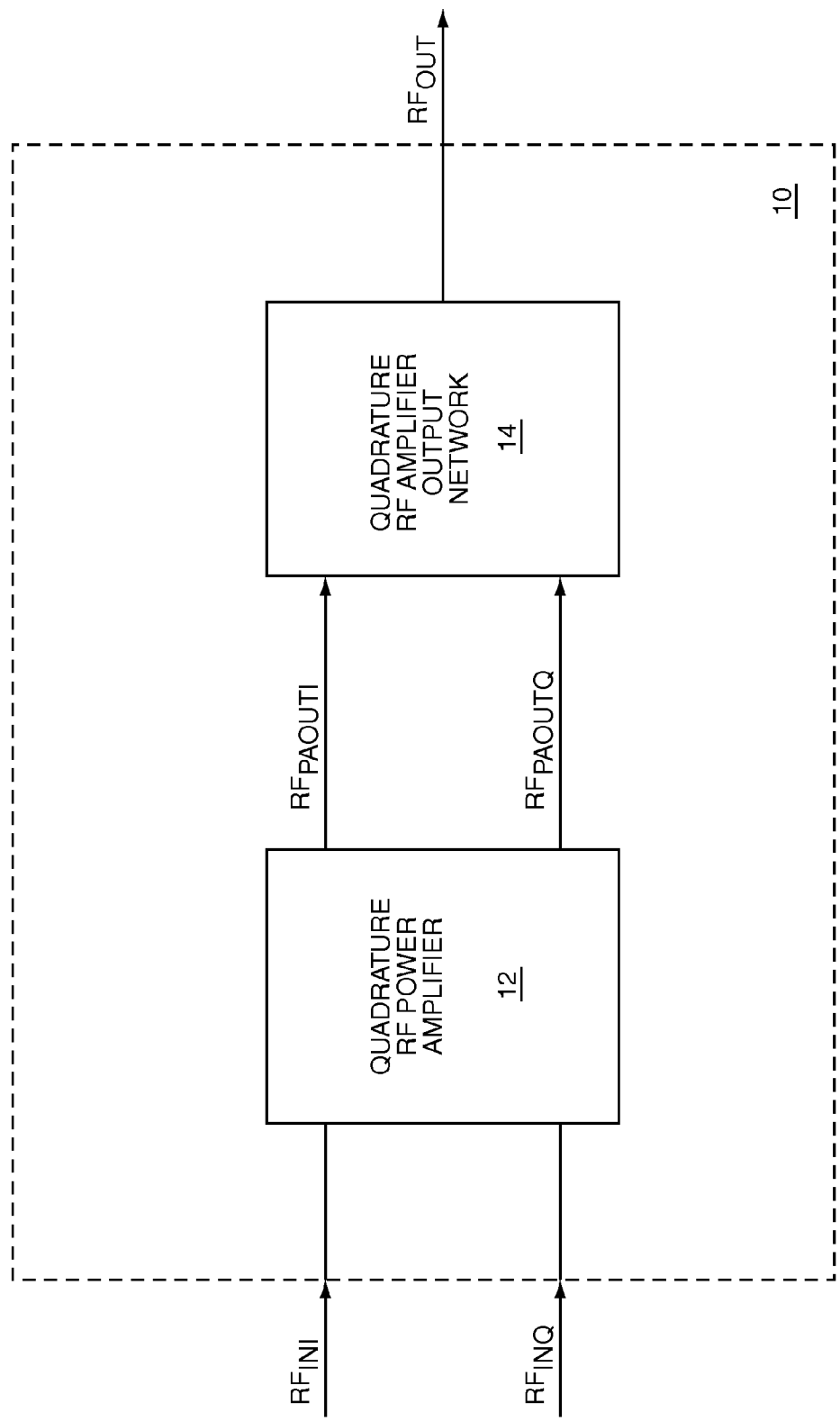
FIG. 1 shows power amplifier circuitry, which includes a quadrature RF power amplifier and a quadrature RF amplifier output network according to one embodiment of the present invention.

FIG. 1 shows power amplifier circuitry 10, which includes a quadrature RF power amplifier 12 and a quadrature RF amplifier output network 14 according to one embodiment of the present invention. The quadrature RF power amplifier 12 receives an in-phase RF input signal $RF_{INI}$ and a quadrature-phase RF input signal $RF_{INQ}$, which are amplified to create an in-phase RF output signal $RF_{PAOUTI}$ and a quadrature-phase RF output signal $RF_{PAOUTQ}$. Under nominal operating conditions, the quadrature output signals $RF_{PAOUTI}$, $RF_{PAOUTQ}$ are phase-shifted by approximately 90 degrees from each other, and are of approximately equal amplitude. The quadrature RF amplifier output network 14 receives the quadrature output signals $RF_{PAOUTI}$, $RF_{PAOUTQ}$, which are phase-shifted a total of approximately 90 degrees such that they are in-phase with respect to each other, and are then combined to create a combined RF output signal $RF_{OUT}$. The quadrature RF amplifier output network 14 includes impedance transformation circuitry to transform an impedance that is presented to the output of the quadrature RF amplifier output network 14 into a desired quadrature impedance that is presented to the outputs of the quadrature RF power amplifier 12. The phase-shifting and combining tends to reduce the impact of reflected signals on net RF power transfer to downstream circuitry from the quadrature RF amplifier output network 14. Such downstream circuitry may include an antenna, or an antenna fed with a diplexer or switch.

Figure 2:
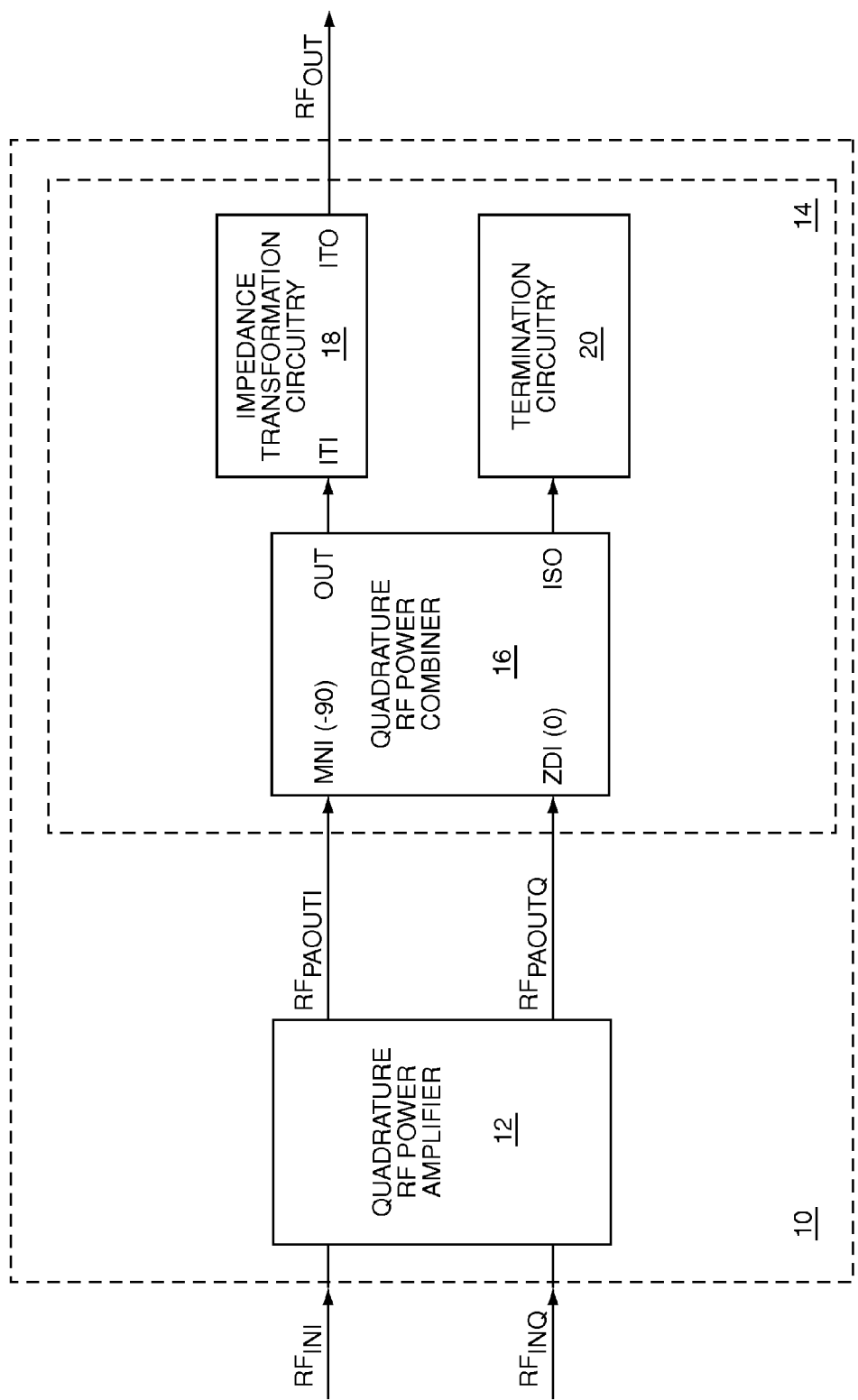
FIG. 2 shows details of a first embodiment of the quadrature RF amplifier output network illustrated in FIG. 1.

FIG. 2 shows details of a first embodiment of the quadrature RF amplifier output network 14 illustrated in FIG. 1. The in-phase RF output signal $RF_{PAOUTI}$ is fed into a minus ninety degree input MNI of a quadrature RF power combiner 16. The quadrature-phase RF output signal $RF_{PAOUTQ}$ is fed into a zero degree input ZDI of the quadrature RF power combiner 16. The quadrature RF power combiner 16 provides a combined RF output signal from a combined RF output OUT, which is coupled to an impedance transformation input ITI of impedance transformation circuitry 18. The impedance transformation circuitry 18 provides the combined RF output signal $RF_{OUT}$ from an impedance transformation output ITO, which is coupled to downstream circuitry, such as an antenna or antenna circuitry. The impedance transformation circuitry 18 transforms the impedance presented to the impedance transformation output ITO into an impedance better suited for optimum power transfer from the quadrature RF power amplifier 12. The transformed impedance is presented at the impedance transformation input ITI, which is presented to the combined RF output OUT. Normally, the impedance presented to the combined RF output OUT is presented to the quadrature inputs MNI, ZDI of the quadrature RF power combiner 16; therefore, the outputs from the quadrature RF power amplifier 12 are presented with the transformed impedance. An isolated output ISO from the quadrature RF power combiner 16 feeds termination circuitry 20.

The present invention takes advantage of certain behavioral characteristics of commonly used quadrature RF power combiners 16. When the quadrature inputs MNI, ZDI are fed with two equal amplitude quadrature-phase input signals, the quadrature RF power combiner 16 behaves as a power combiner by phase-shifting and combining the input signals to create a combined RF output signal, which is provided from the combined RF output OUT. Normally, no signals appear at the isolated output ISO; however, imbalanced input signals or reflected signals from the combined RF output OUT can be phase-shifted and combined and may appear at the isolated output ISO. A number of different commonly available architectures may be suitable for the quadrature RF power combiner 16, including but not limited to coupled inductors, coupled transmission lines, a lumped element equivalent of coupled transmission lines, a Lange coupler, a Wilkinson combiner, a Fisher hybrid, a lumped element equivalent of a Lange coupler, in-phase combiners coupled to phase-shift networks, directional branchline couplers, or directional overlay couplers. The quadrature RF power combiner 16 may include stripline technology, lumped elements, or both. The quadrature RF power combiner 16 may be provided commercially or fabricated as part of other circuitry. One commercially available quadrature power divider and combiner 14 is Hybrid Coupler Model XG1900A-03 provided by Anaren.

The termination circuitry 20 terminates any extraneous signals that may appear at the isolated output ISO.

In certain embodiments of the present invention, none, some, or all of the elements of the quadrature RF power amplifier 12; none, some, or all of the elements of the quadrature RF power combiner 16; none, some, or all of the elements of the impedance transformation circuitry 18; none, some, or all of the elements of the termination circuitry 20; or any combination thereof, may be provided by a common semiconductor die or by multiple semiconductor dies attached to a common substrate. In a first exemplary embodiment of the present invention, the common semiconductor die comprises gallium arsenide (GaAs). In a second exemplary embodiment of the present invention, at least one of the multiple semiconductor dies comprises GaAs. In a third exemplary embodiment of the present invention, the common substrate comprises GaAs.

Figure 3:
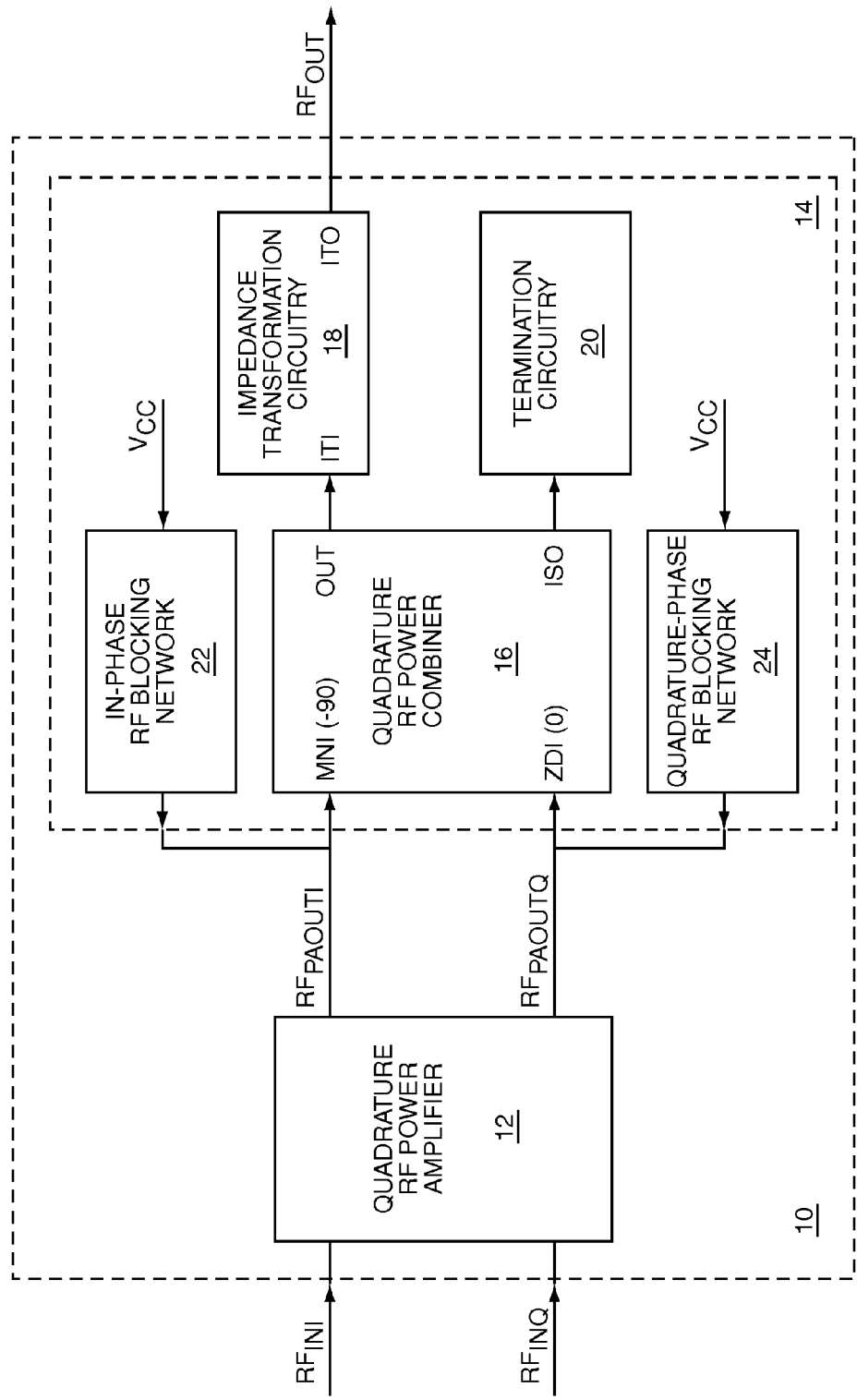
FIG. 3 shows details of a second embodiment of the quadrature RF amplifier output network illustrated in FIG. 1.

FIG. 3 shows details of a second embodiment of the quadrature RF amplifier output network 14 illustrated in FIG. 1. An in-phase RF blocking network 22 is coupled between a DC supply voltage $V_{cc}$ and the minus ninety degree input MNI. A quadrature-phase RF blocking network 24 is coupled between the DC supply voltage $V_{cc}$ and the zero degree input ZDI. The RE blocking networks 22, 24 provide a DC supply for output transistors in the final stages of the quadrature RF power amplifier 12. The RF blocking networks 22, 24 include RF blocking elements to isolate the DC supply voltage $V_{cc}$ from the quadrature output signals $RF_{PAOUTI}$, $RF_{PAOUTQ}$, by blocking RF current.

Figure 4:
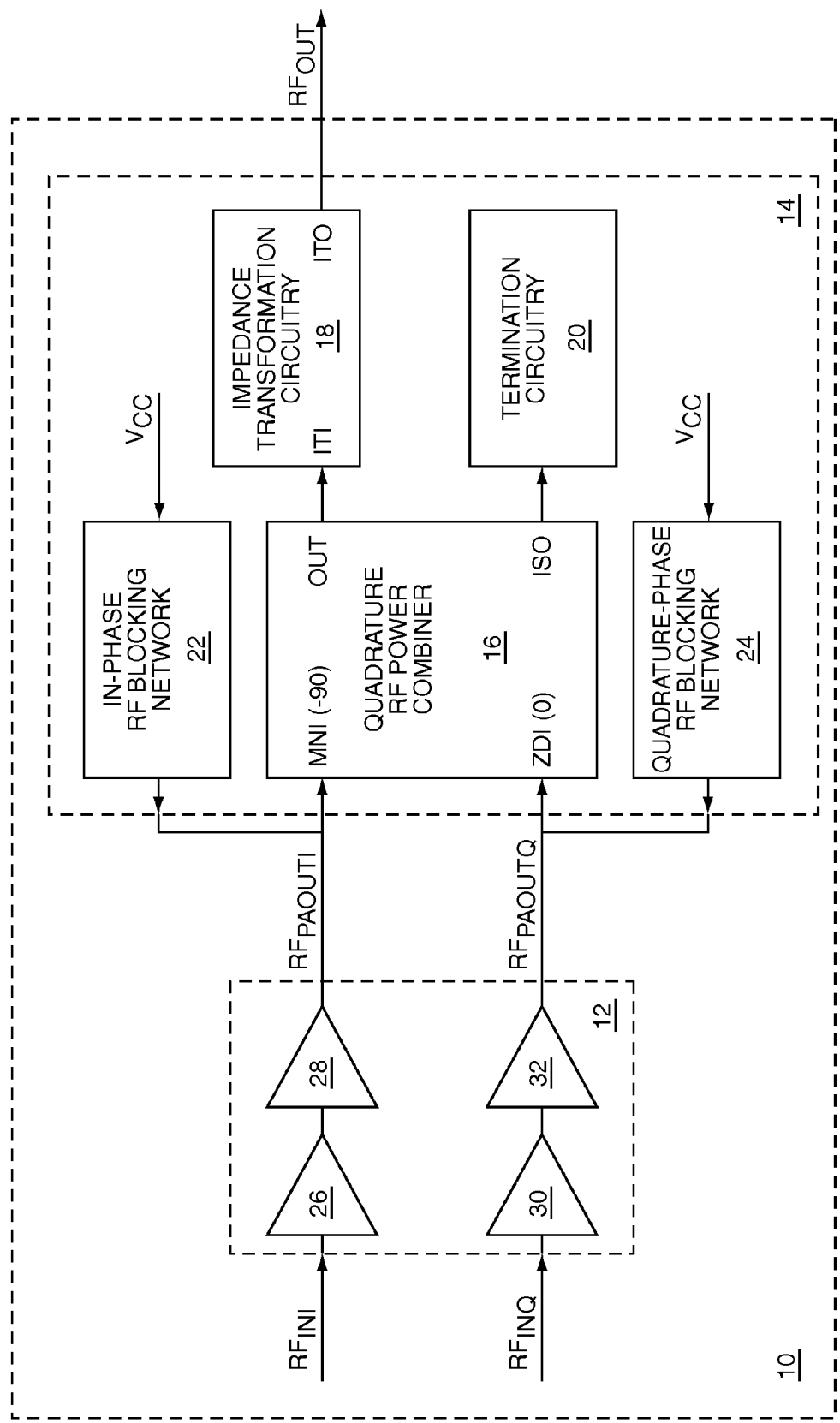
FIG. 4 shows details of the quadrature RF power amplifier illustrated in FIG. 1.

FIG. 4 shows details of the quadrature RF power amplifier 12 illustrated in FIG. 1. The quadrature RF power amplifier 12 may include in-phase driver circuitry 26 with one or more amplifier stages feeding an in-phase final stage 28, which provides the in-phase RF output signal $RF_{PAOUTI}$ from an in-phase power amplifier output. The quadrature RF power amplifier 12 may also include quadrature-phase driver circuitry 30 with one or more amplifier stages feeding a quadrature-phase final stage 32, which provides the quadrature-phase RF output signal $RF_{PAOUTQ}$ from a quadrature-phase power amplifier output.

Figure 5:
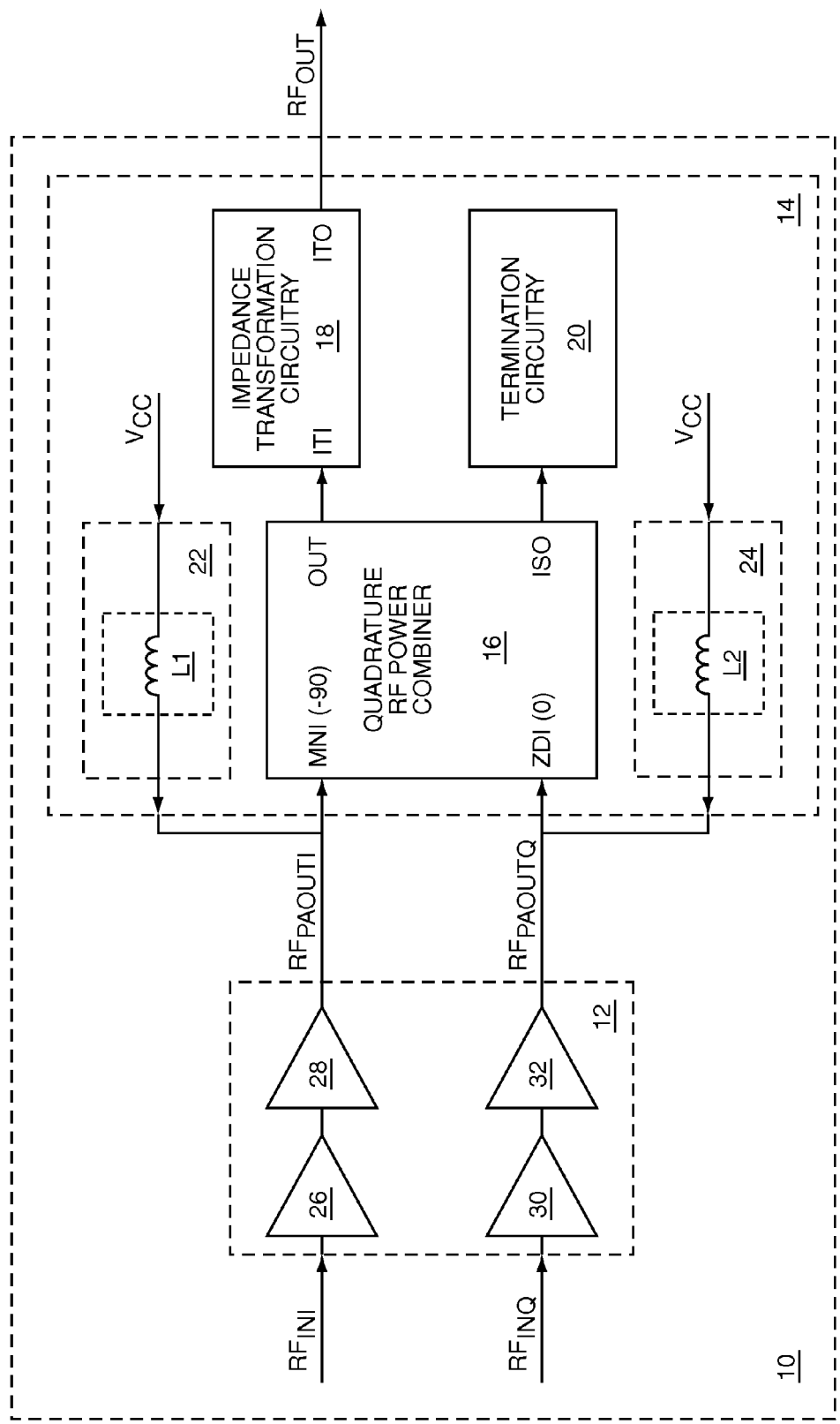
FIG. 5 shows one embodiment of the RF blocking networks illustrated in FIG. 3.

FIG. 5 shows one embodiment of the RF blocking networks 22, 24 illustrated in FIG. 3. The in-phase RF blocking network 22 includes an in-phase blocking inductive element L1 coupled between the DC supply voltage $V_{cc}$ and the in-phase power amplifier output. The quadrature-phase RF blocking network 24 includes a quadrature-phase blocking inductive element L2 coupled between the DC supply voltage $V_{cc}$ and the quadrature-phase power amplifier output.

Figure 6:
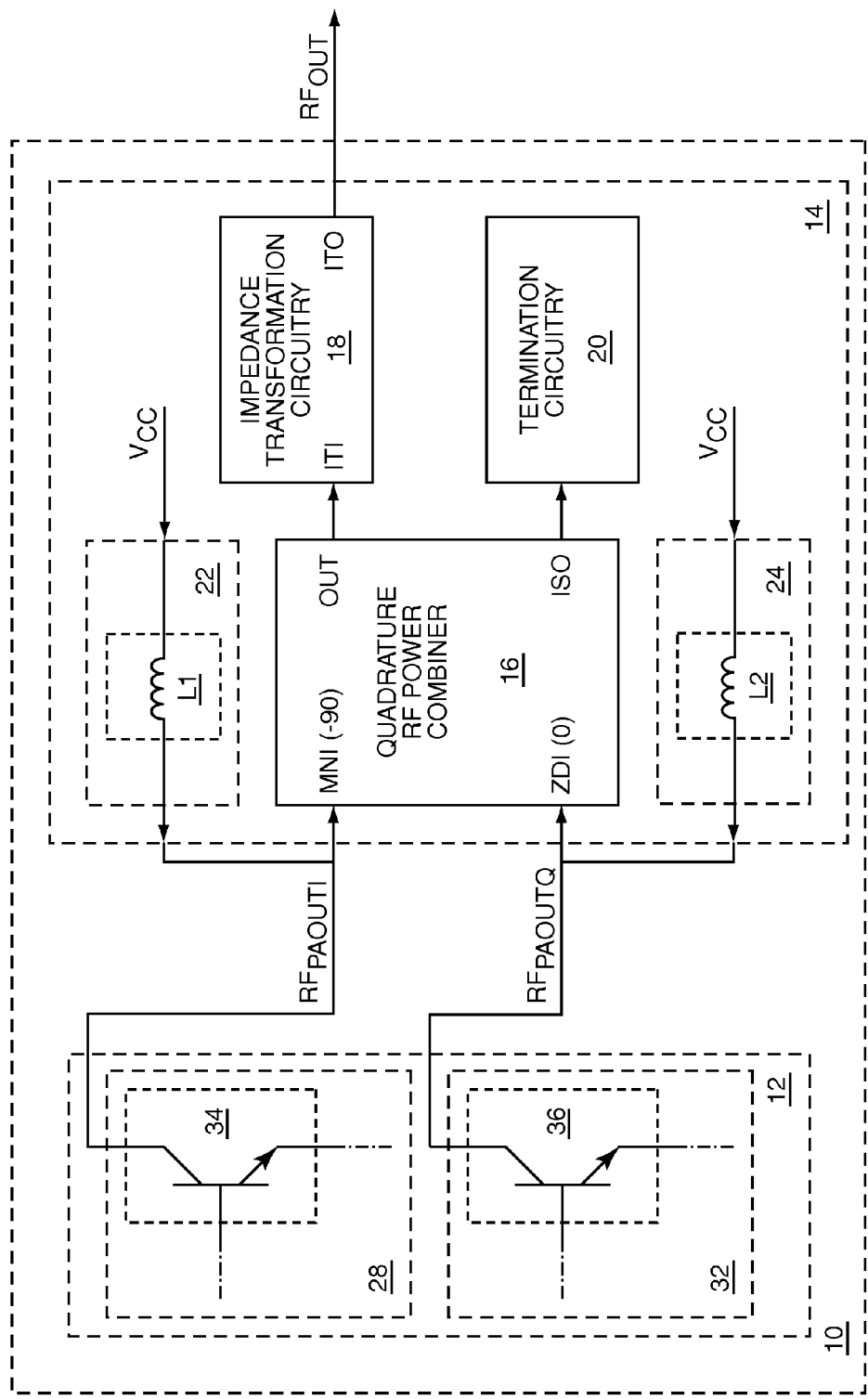
FIG. 6 shows a first embodiment of the final amplifier stages illustrated in FIG. 4.

FIG. 6 shows a first embodiment of the final amplifier stages 28, 32 illustrated in FIG. 4. The in-phase final stage 28 includes an in-phase bipolar output transistor element 34. The collector of the in-phase bipolar output transistor element 34 may provide the in-phase power amplifier output. The quadrature-phase final stage 32 includes a quadrature-phase bipolar output transistor element 36. The collector of the quadrature-phase bipolar output transistor element 36 may provide the quadrature-phase power amplifier output. In one embodiment of the present invention, the collector of the in-phase bipolar output transistor element 34 is coupled to the DC supply voltage $V_{cc}$ through the in-phase RF blocking network 22, and the collector of the quadrature-phase bipolar output transistor element 36 is coupled to the DC supply voltage $V_{cc}$ through the quadrature-phase RF blocking network 24. The bipolar output transistor elements 34, 36 may include heterojunction bipolar transistors (HBTs). In an exemplary embodiment of the present invention, the bipolar output transistor elements 34, 36 include gallium arsenide (GaAs) HBTs.

Figure 7:
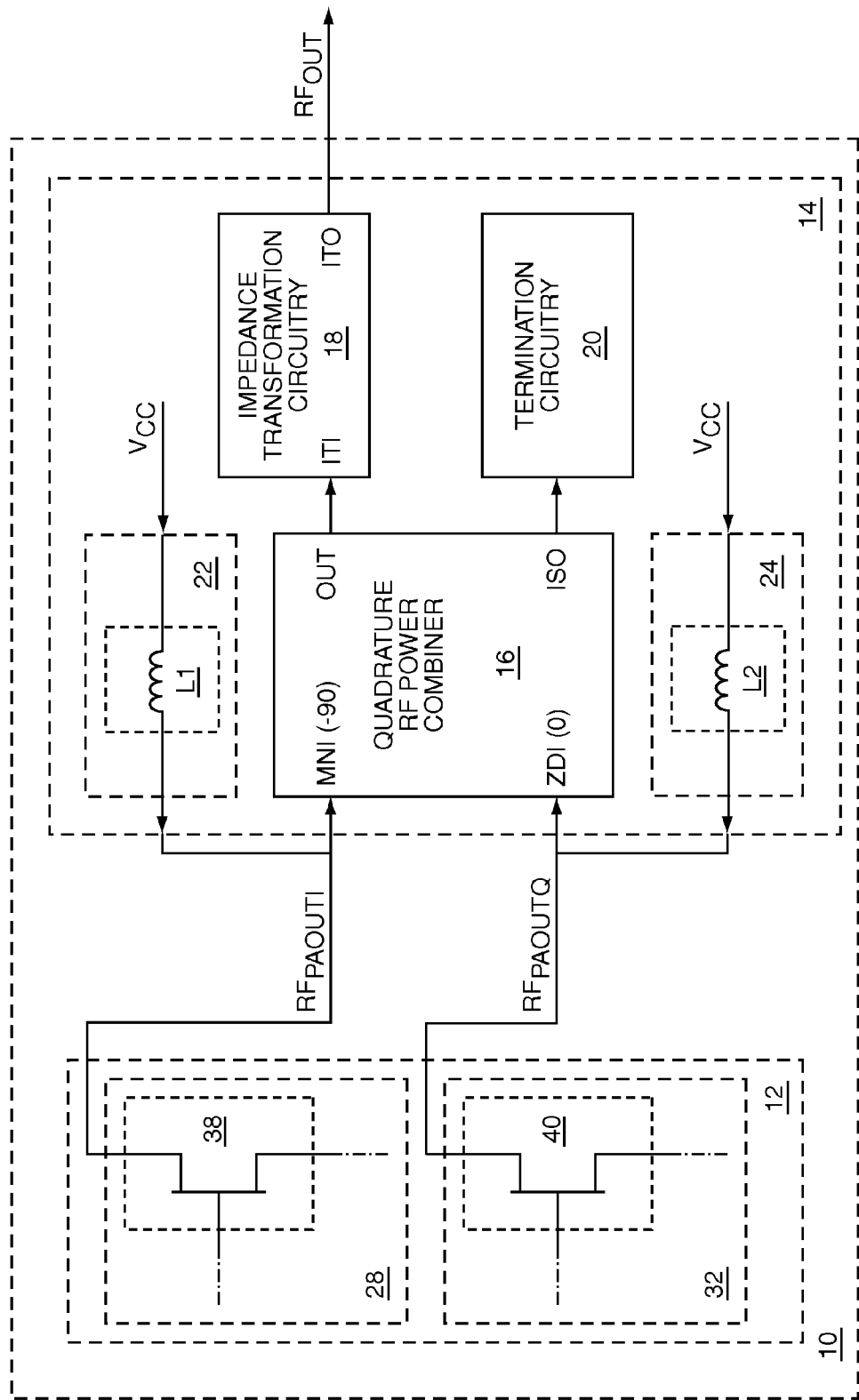
FIG. 7 shows a second embodiment of the final amplifier stages illustrated in FIG. 4.

FIG. 7 shows a second embodiment of the final amplifier stages 28, 32 illustrated in FIG. 4. The in-phase final stage 28 includes an in-phase field effect transistor (FET) element 38. The drain of the in-phase FET element 38 may provide the in-phase power amplifier output. The quadrature-phase final stage 32 includes a quadrature-phase FET element 40. The drain of the quadrature-phase FET element 40 may provide the quadrature-phase power amplifier output. In one embodiment of the present invention, the drain of the in-phase FET element 38 is coupled to the DC supply voltage $V_{cc}$ through the in-phase RF blocking network 22, and the drain of the quadrature-phase FET element 40 is coupled to the DC supply voltage $V_{cc}$ through the quadrature-phase RF blocking network 24.

Figure 8:
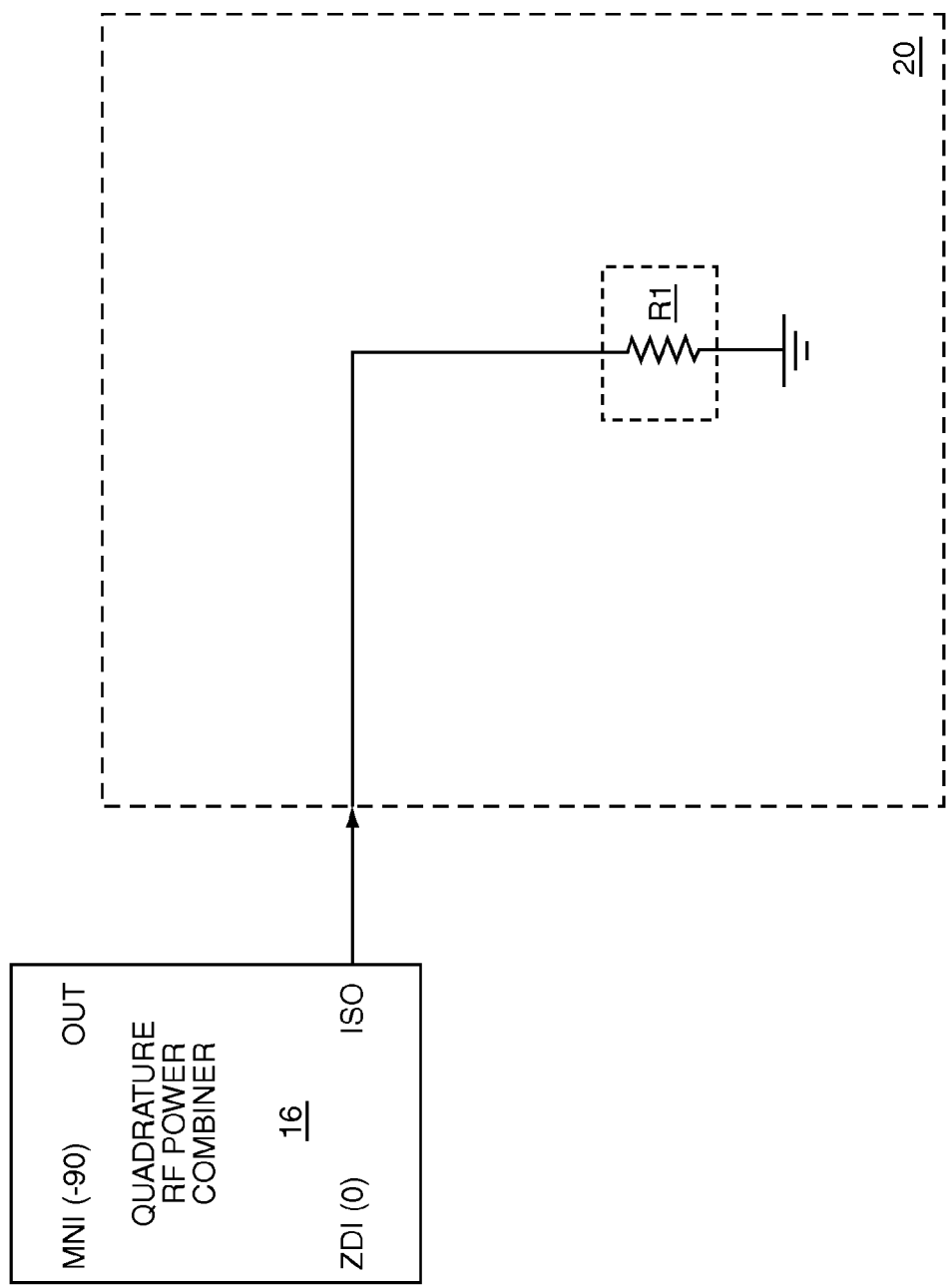
FIG. 8 shows a first embodiment of the termination circuitry illustrated in FIG. 2.

FIG. 8 shows a first embodiment of the termination circuitry 20 illustrated in FIG. 2. The termination circuitry 20 includes a termination resistive element R1 to absorb energy received from any extraneous signals that may appear at the isolated output ISO of the quadrature RF power combiner 16. The resistance of the termination resistive element R1 may be approximately equal to the impedance presented to the combined RF output OUT of the quadrature RF power combiner 16.

Figure 9:
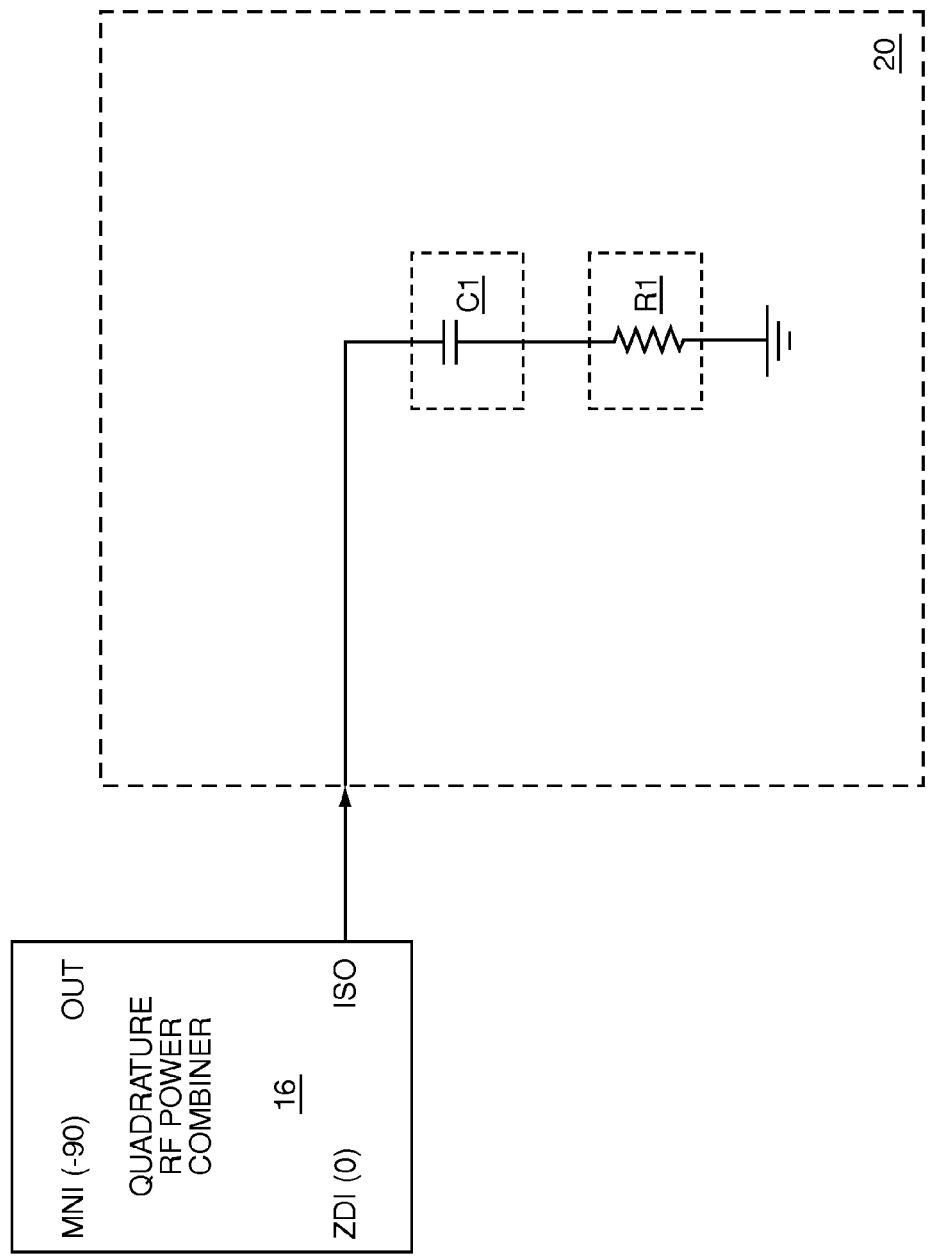
FIG. 9 shows a second embodiment of the termination circuitry illustrated in FIG. 2.

FIG. 9 shows a second embodiment of the termination circuitry 20 illustrated in FIG. 2. A termination capacitive element C1 is coupled in series with the termination resistive element R1 illustrated in FIG. 8. The termination capacitive element C1 is used to block DC signals between the isolated output ISO of the quadrature RF power combiner 16 and ground, by blocking DC current. The termination capacitive element C1 may be needed for those embodiments of the present invention that include RF blocking networks 22, 24 to block the DC supply voltage $V_{cc}$ from ground.

Figure 10:
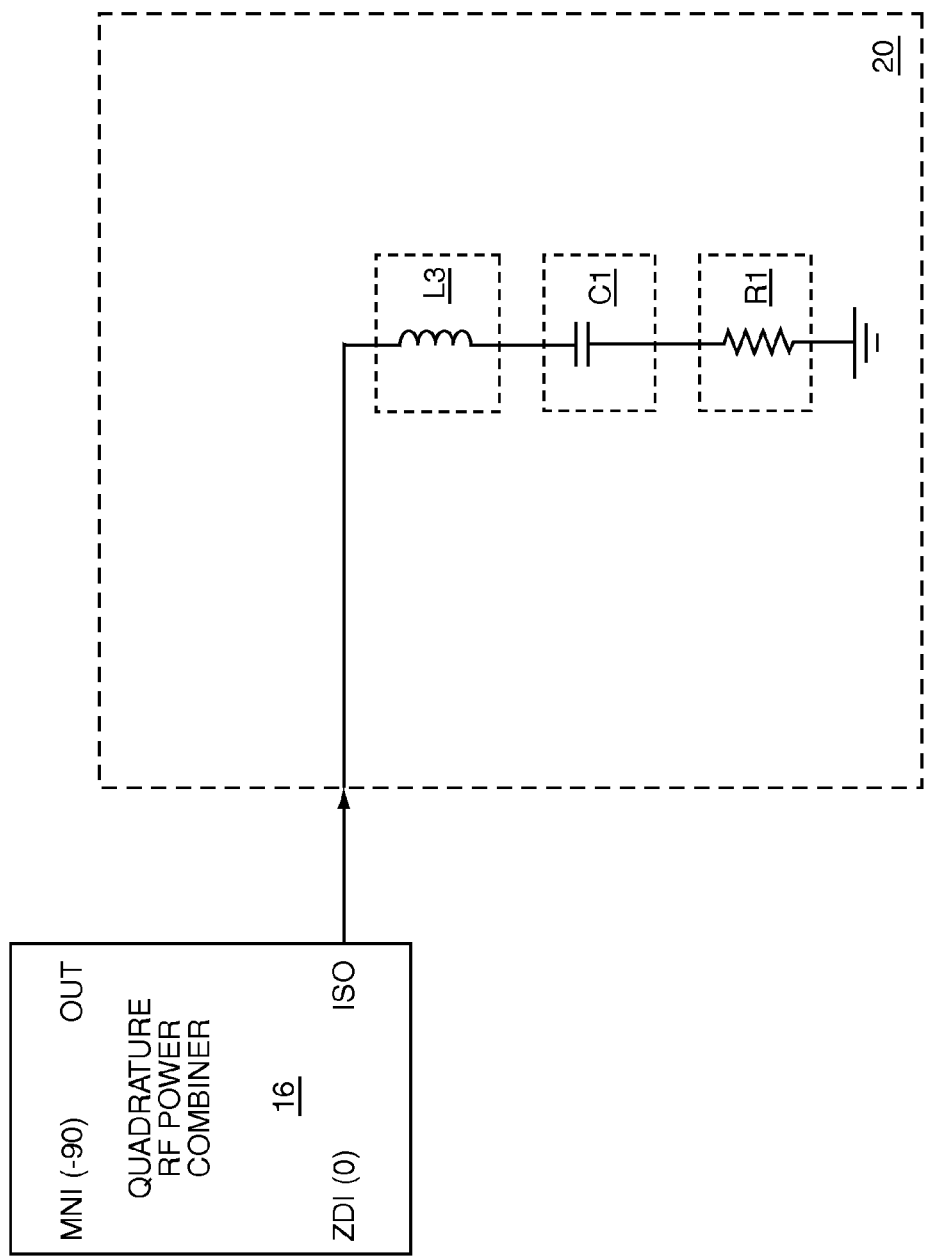
FIG. 10 shows a third embodiment of the termination circuitry illustrated in FIG. 2.

FIG. 10 shows a third embodiment of the termination circuitry 20 illustrated in FIG. 2. A termination inductive element L3 is coupled in series with the termination capacitive element C1 and the termination resistive element R1 illustrated in FIG. 9. The inductive reactance of the termination inductive element L3 may be approximately equal to the capacitive reactance of the termination capacitive element C1 at a transmit carrier frequency to substantially cancel the effects of the capacitive reactance of the termination capacitive element C1.

Figure 11:
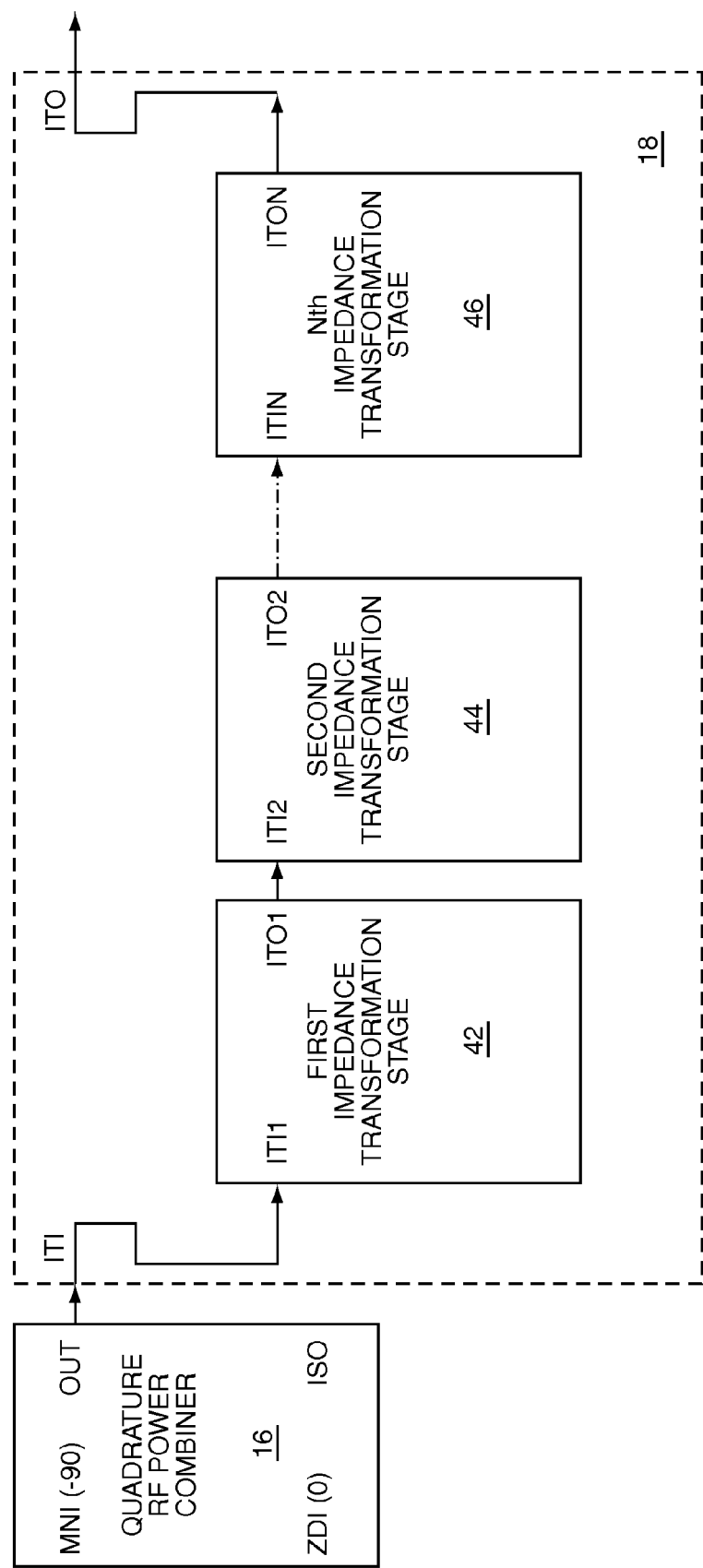
FIG. 11 shows one embodiment of the impedance transformation circuitry illustrated in FIG. 2.

FIG. 11 shows one embodiment of the impedance transformation circuitry 18 illustrated in FIG. 2. Typically, the impedance presented by downstream circuitry, such as antenna circuitry, is higher than the impedances presented to the outputs of the quadrature RF amplifier for optimum RF power transfer. In an exemplary embodiment of the present invention, the impedance presented by the antenna circuitry is approximately 50 ohms and the impedances presented to the outputs of the quadrature RF amplifier are approximately 25 ohms. The impedance transformation circuitry 18 may use reactive elements to transform the impedance. To increase the bandwidth of the impedance transformation circuitry 18, multiple stages may be used. The greater the number of stages, the larger the bandwidth of the impedance transformation circuitry 18. One embodiment of the impedance transformation circuitry 18 may use one or more impedance transformation stages.

The impedance transformation circuitry 18 illustrated in FIG. 11 uses N impedance transformation stages. The impedance transformation input ITI of the impedance transformation circuitry 18 is coupled to a first impedance transformation input ITI1 of a first impedance transformation stage 42. A first impedance transformation output 1101 from the first impedance transformation stage 42 is coupled to a second impedance transformation input ITI2 of a second impedance transformation stage 44. A second impedance transformation output ITO2 from the second impedance transformation stage 44 is coupled to subsequent stages. An impedance transformation output from the last subsequent stage is coupled to an Nth impedance transformation input ITIN of an Nth impedance transformation stage 46. An Nth impedance transformation output ITON from the Nth impedance transformation stage 46 is coupled to the impedance transformation output ITO of the impedance transformation circuitry 18. To provide impedance transformation circuitry 18 with a flat frequency response, the total impedance transformation provided by the impedance transformation circuitry 18 is divided equally amongst the impedance transformation stages 42, 44, 46.

If Zn is the impedance presented to the impedance transformation output ITO of the impedance transformation circuitry 18, Zo is the impedance presented by the impedance transformation input ITI of the impedance transformation circuitry 18, n is the number of impedance transformation stages, and ITR is defined as the impedance transformation ratio of each impedance transformation stage, then $$ITR = [Zn/Zo]^{1/n} \qquad \text{Eq. 1}$$

If m denotes a particular impedance transformation stage such that {m=1, 2, ... n}, Zm is the impedance presented to the mth impedance transformation output ITOm of the mth impedance transformation stage, and Zm−1 is the impedance presented by the mth impedance transformation input ITIm of the mth impedance transformation stage, then $$Zm-1 = Zm/ITR \qquad \text{Eq. 2}$$

Figure 12:
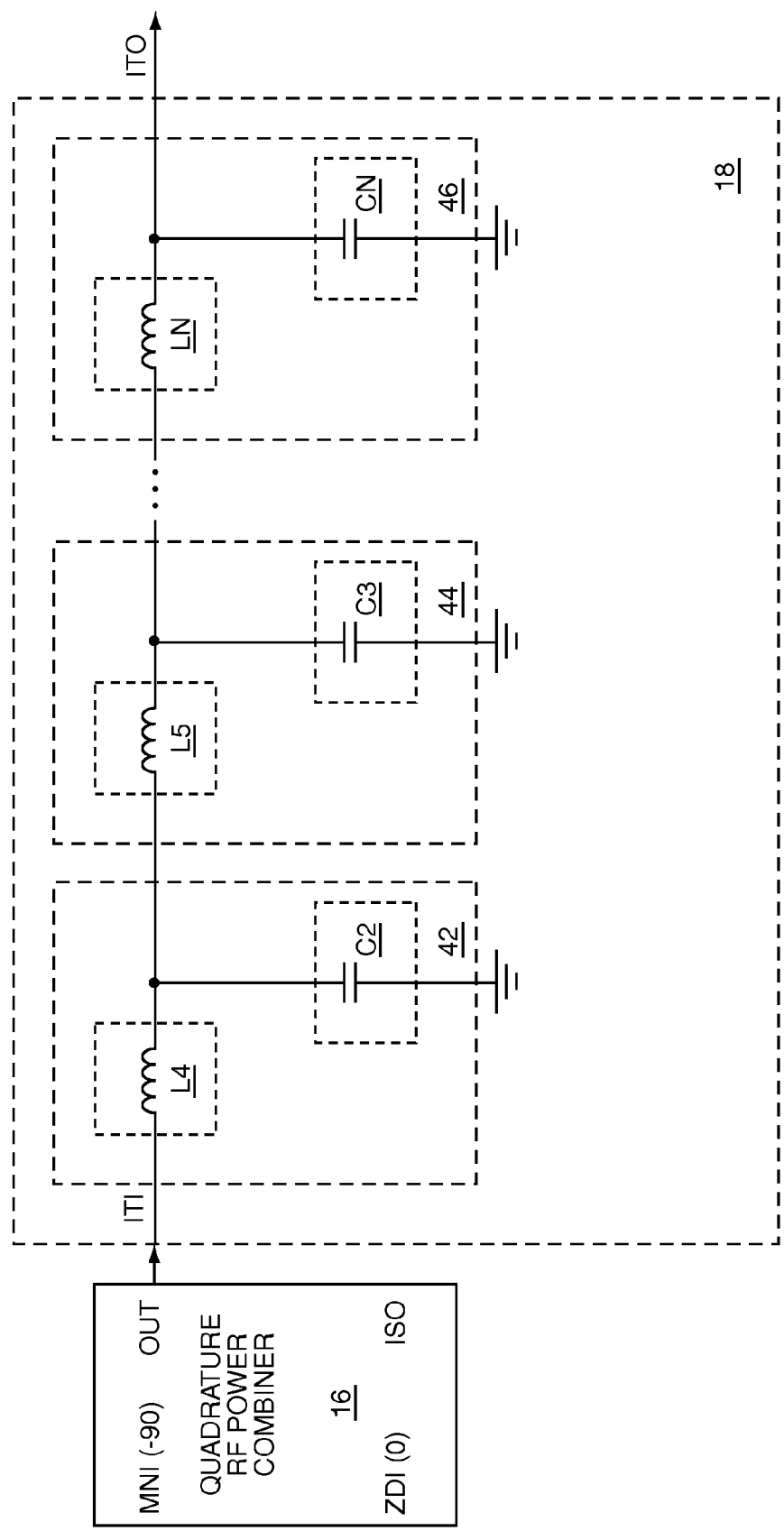
FIG. 12 shows a first embodiment of the impedance transformation circuitry illustrated in FIG. 2.

FIG. 12 shows a first embodiment of the impedance transformation circuitry 18 illustrated in FIG. 2. The first embodiment of the impedance transformation circuitry 18 may use one or more impedance transformation stages. The first impedance transformation stage 42 includes a first impedance transformation inductive element L4 coupled between the first impedance transformation input ITI1 and the first impedance transformation output ITO1. A first impedance transformation capacitive element C2 is coupled between the first impedance transformation output ITO1 and ground. The second impedance transformation stage 44 includes a second impedance transformation inductive element L5 coupled between the second impedance transformation input 1112 and the second impedance transformation output ITO2. A second impedance transformation capacitive element C3 is coupled between the second impedance transformation output ITO2 and ground. The Nth impedance transformation stage 46 includes an Nth impedance transformation inductive element LN coupled between the Nth impedance transformation input ITIN and the Nth impedance transformation output ITON. An Nth impedance transformation capacitive element CN is coupled between the Nth impedance transformation output ITON and ground.

If Lm is the inductance of the impedance transformation inductive element of the mth impedance transformation stage, Cm is the capacitance of the impedance transformation capacitive element of the mth impedance transformation stage, and fo is the design operating center frequency of the impedance transformation circuitry 18, then $$Lm = [(Zm-1)(ITR-1)^{1/2}]/2\pi(fo) \qquad \text{Eq. 3 and}$$

$$Cm = [(ITR-1)^{1/2}]/2\pi(fo)(Zm) \qquad \text{Eq. 4}$$

Figure 13:
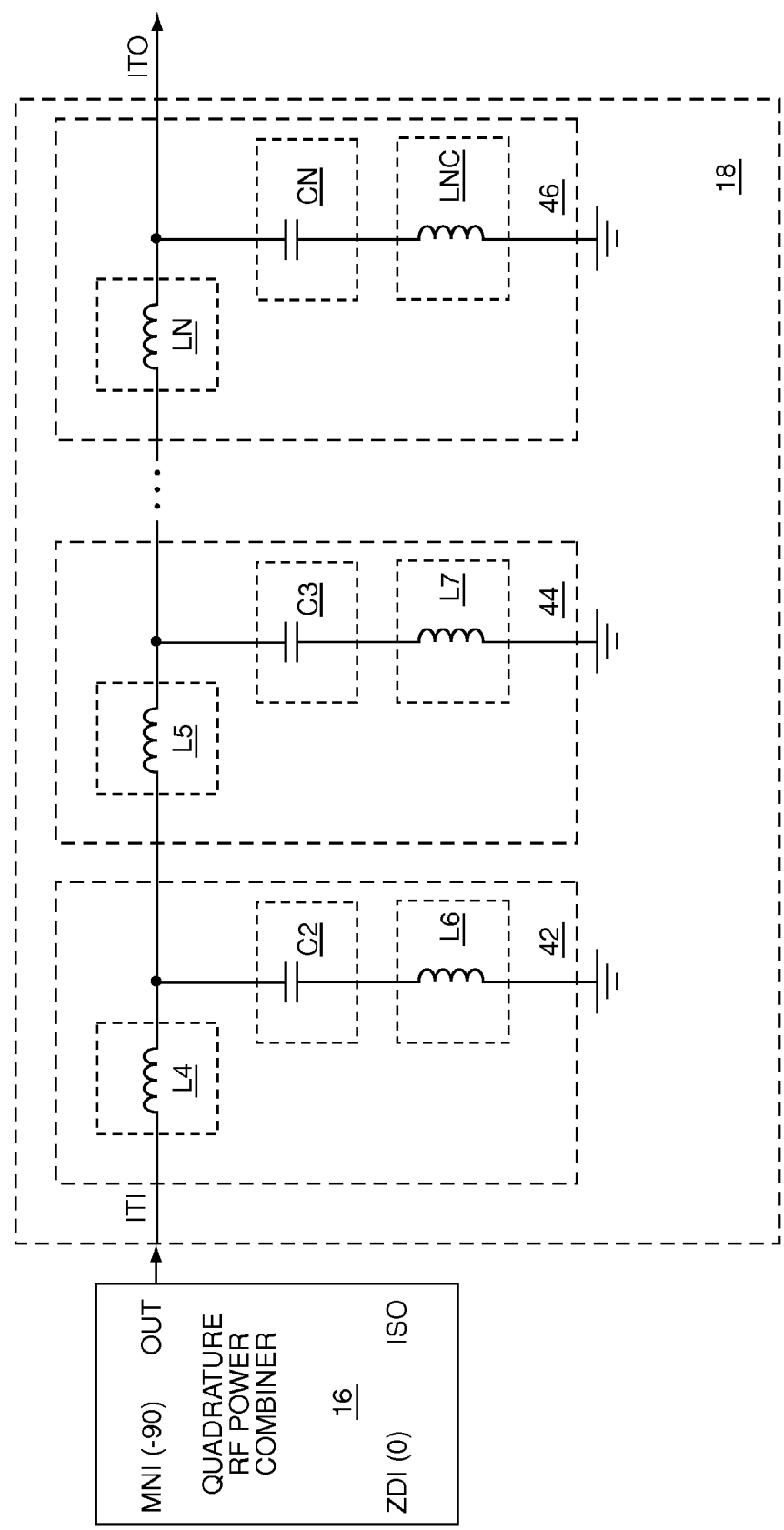
FIG. 13 shows a second embodiment of the impedance transformation circuitry illustrated in FIG. 2.

FIG. 13 shows a second embodiment of the impedance transformation circuitry 18 illustrated in FIG. 2. The second embodiment of the impedance transformation circuitry 18 may use one or more impedance transformation stages. A first harmonic inductive element L6, a second harmonic inductive element L7, and an Nth harmonic inductive element LNC are added to the impedance transformation circuitry 18 illustrated in FIG. 12. The first harmonic inductive element L6 is coupled between the first impedance transformation capacitive element C2 and ground. The second harmonic inductive element L7 is coupled between the second impedance transformation capacitive element C3 and ground. The Nth harmonic inductive element LNC is coupled between the Nth impedance transformation capacitive element CN and ground. The harmonic inductive elements L6, L7, LNC may be used to substantially cancel harmonics of the design operating center frequency by matching the inductive reactances of the harmonic inductive elements L6, L7, LNC with the respective capacitive reactances of the impedance transformation capacitive elements C2, C3, CN at the harmonic of interest. Pairs of harmonic inductive elements and impedance transformation capacitive elements may be all targeted toward a single harmonic, combined in any way to target two or more harmonics, or each targeted toward its own harmonic.

If Lm is the inductance of the impedance transformation inductive element of the mth impedance transformation stage, Lmc is the inductance of the harmonic inductive element of the mth impedance transformation stage, Cm is the capacitance of the impedance transformation capacitive element of the mth impedance transformation stage, fo is the design operating center frequency of the impedance transformation circuitry 18, and Km is the harmonic of the design operating center frequency to be canceled by the mth impedance transformation stage, then $$Lm = [(Zm-1)(ITR-1)^{1/2}]/2\pi(fo) \qquad \text{Eq. 5 and}$$

$$Lmc = Zm/2\pi(fo)[(ITR-1)^{1/2}](Km^2-1) \qquad \text{Eq. 6 and}$$

$$Cm = [[(ITR-1)^{1/2}]/2\pi(fo)(Zm)](1-1/Km^2) \qquad \text{Eq. 7}$$

Figure 14:
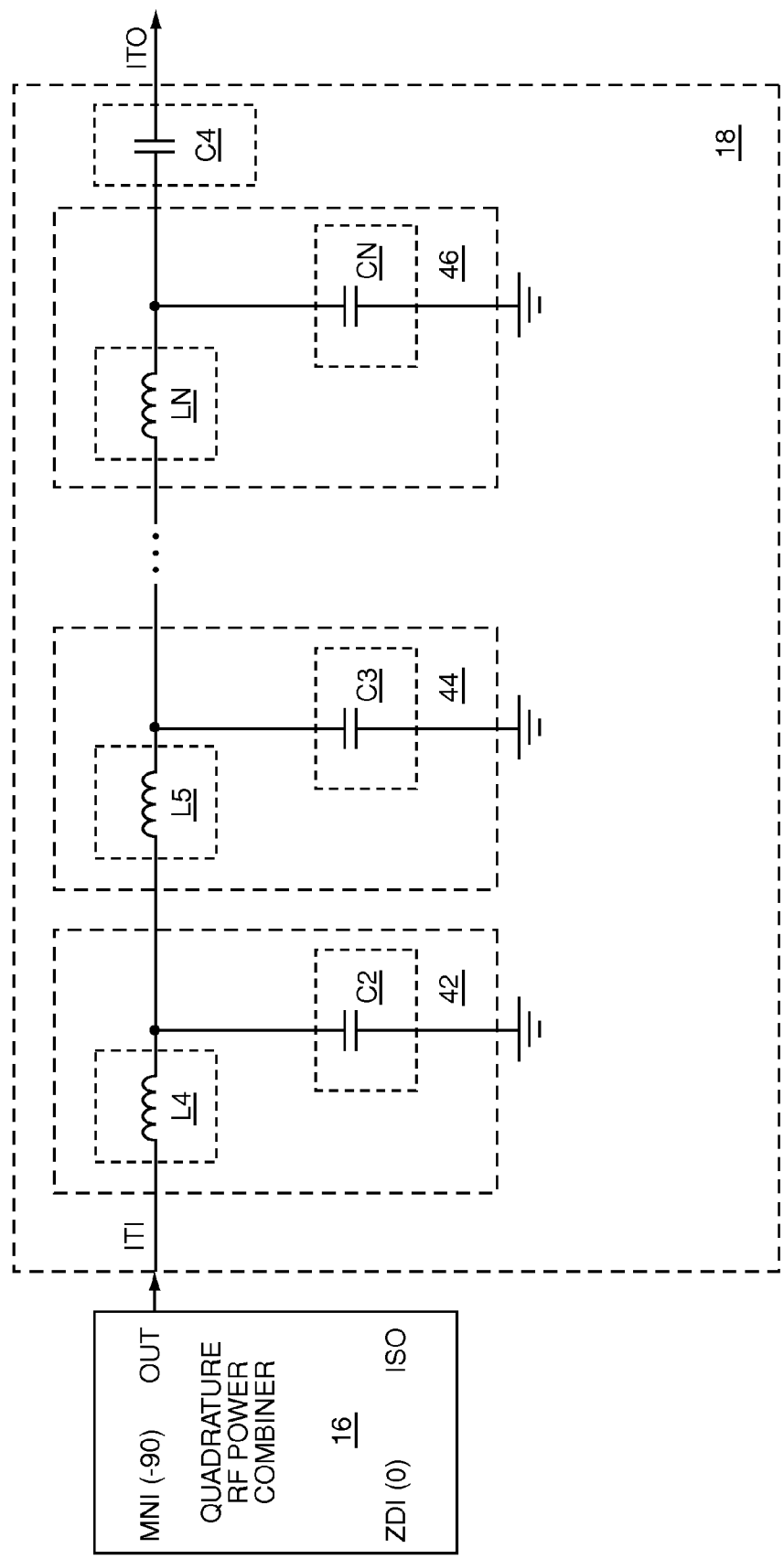
FIG. 14 shows a third embodiment of the impedance transformation circuitry illustrated in FIG. 2.

FIG. 14 shows a third embodiment of the impedance transformation circuitry 18 illustrated in FIG. 2. The third embodiment of the impedance transformation circuitry 18 may use one or more impedance transformation stages. A blocking capacitive element C4 is added to the impedance transformation circuitry 18 illustrated in FIG. 12. The blocking capacitive element C4 is coupled between the impedance transformation output ITO and the Nth impedance transformation output ITON to block DC signals between the impedance transformation output ITO and upstream circuitry. The blocking capacitive element C4 may be needed for those embodiments of the present invention that include RF blocking networks 22, 24 to block the DC supply voltage $V_{cc}$ from downstream circuitry, such as an antenna or antenna circuitry.

Figure 15:
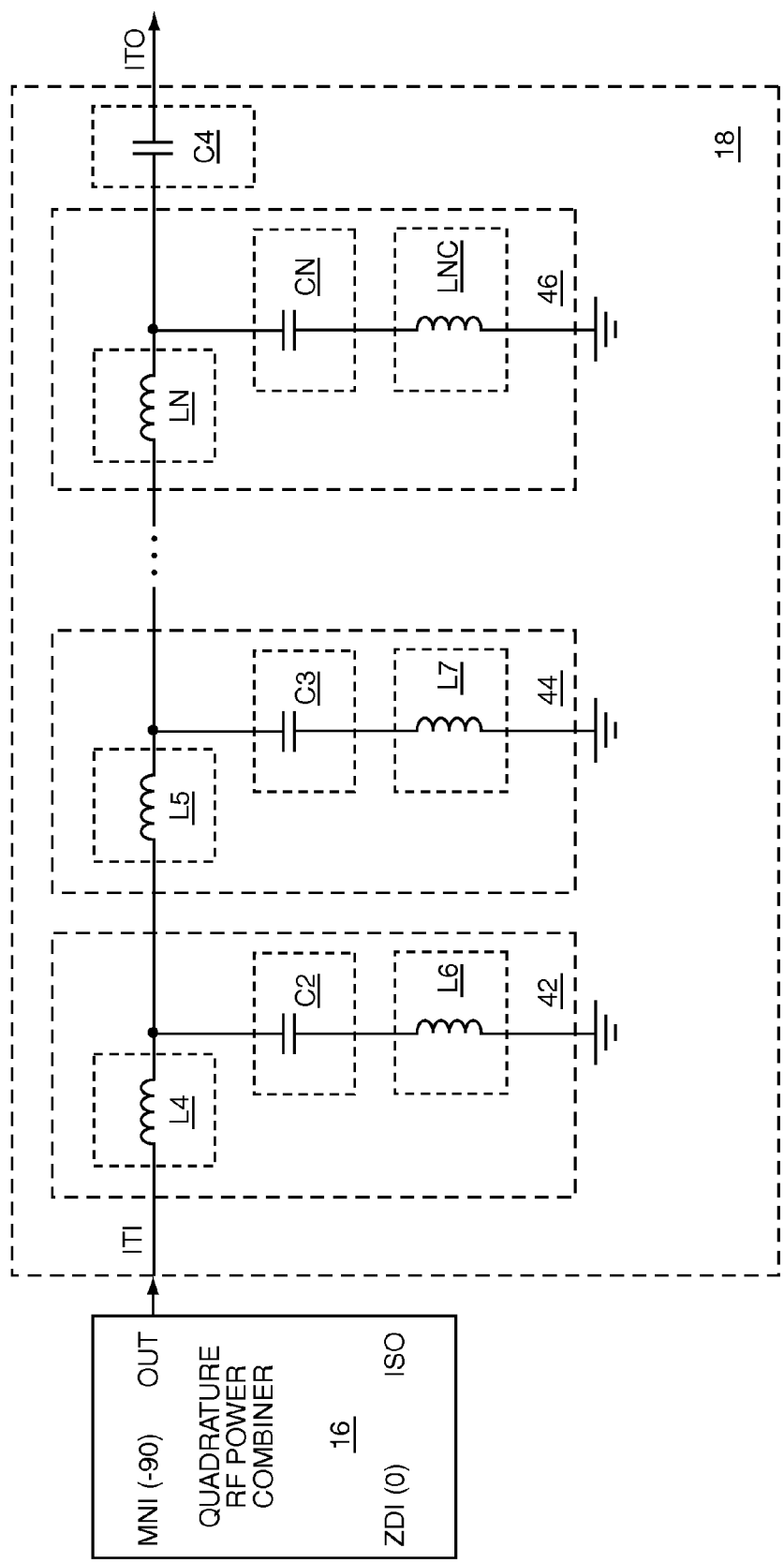
FIG. 15 shows a fourth embodiment of the impedance transformation circuitry illustrated in FIG. 2.

FIG. 15 shows a fourth embodiment of the impedance transformation circuitry 18 illustrated in FIG. 2. The fourth embodiment of the impedance transformation circuitry 18 may use one or more impedance transformation stages. A blocking capacitive element C4 is added to the impedance transformation circuitry 18 illustrated in FIG. 13. The blocking capacitive element C4 is coupled between the impedance transformation output ITO and the Nth impedance transformation output ITON to block DC signals between the impedance transformation output ITO and upstream circuitry. The blocking capacitive element C4 may be needed for those embodiments of the present invention that include RF blocking networks 22, 24 to block the DC supply voltage $V_{cc}$ from downstream circuitry, such as an antenna or antenna circuitry.

Figure 16:
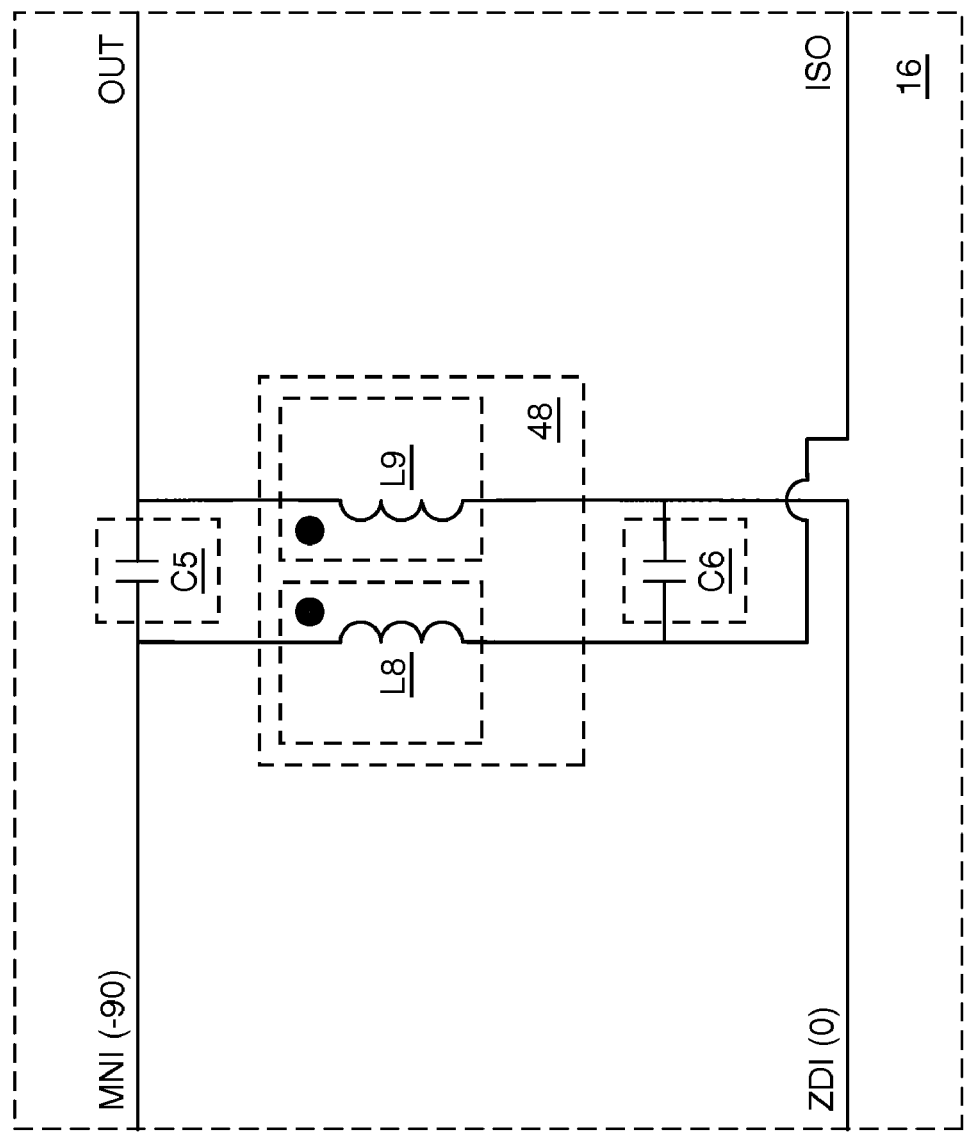
FIG. 16 shows one embodiment of the quadrature RF power combiner illustrated in FIG. 2.

FIG. 16 shows one embodiment of the quadrature RF power combiner 16 illustrated in FIG. 2. A coupled inductor network 48 includes a first node coupled to the minus ninety degree input MNI, a second node coupled to the zero degree input ZDI, a third node coupled to the combined RF output OUT, and a fourth node coupled to the isolated output ISO. The coupled inductor network 48 further includes a first coupled inductive element L8 coupled between the first node and the fourth node, and a second coupled inductive element L9 coupled between the second node and the third node. The coupled inductive elements L8, L9 are magnetically coupled to each other to share the magnetic fields associated with each of the coupled inductive elements L8, L9. The magnetic coupling of the coupled inductive elements L8, L9 is oriented such that the end of the first coupled inductive element L8 that is coupled to the first node is magnetically coupled to the end of the second coupled inductive element L9 that is coupled to the third node. A first combiner capacitive element C5 is coupled between the minus ninety degree input MNI and the combined RF output OUT. A second combiner capacitive element C6 is coupled between the zero degree input ZDI and the isolated output ISO.

If fo is the design operating center frequency and Zo is the design impedance of the quadrature RF power combiner and the coupling coefficient between coupled inductive elements L8 and L9 is unity, then $$L8 = L9 = Zo/2\pi(fo) \qquad \text{Eq. 8 and}$$

$$C5 = C6 = 1/4\pi(fo)(Zo) \qquad \text{Eq. 9}$$

Figure 17:
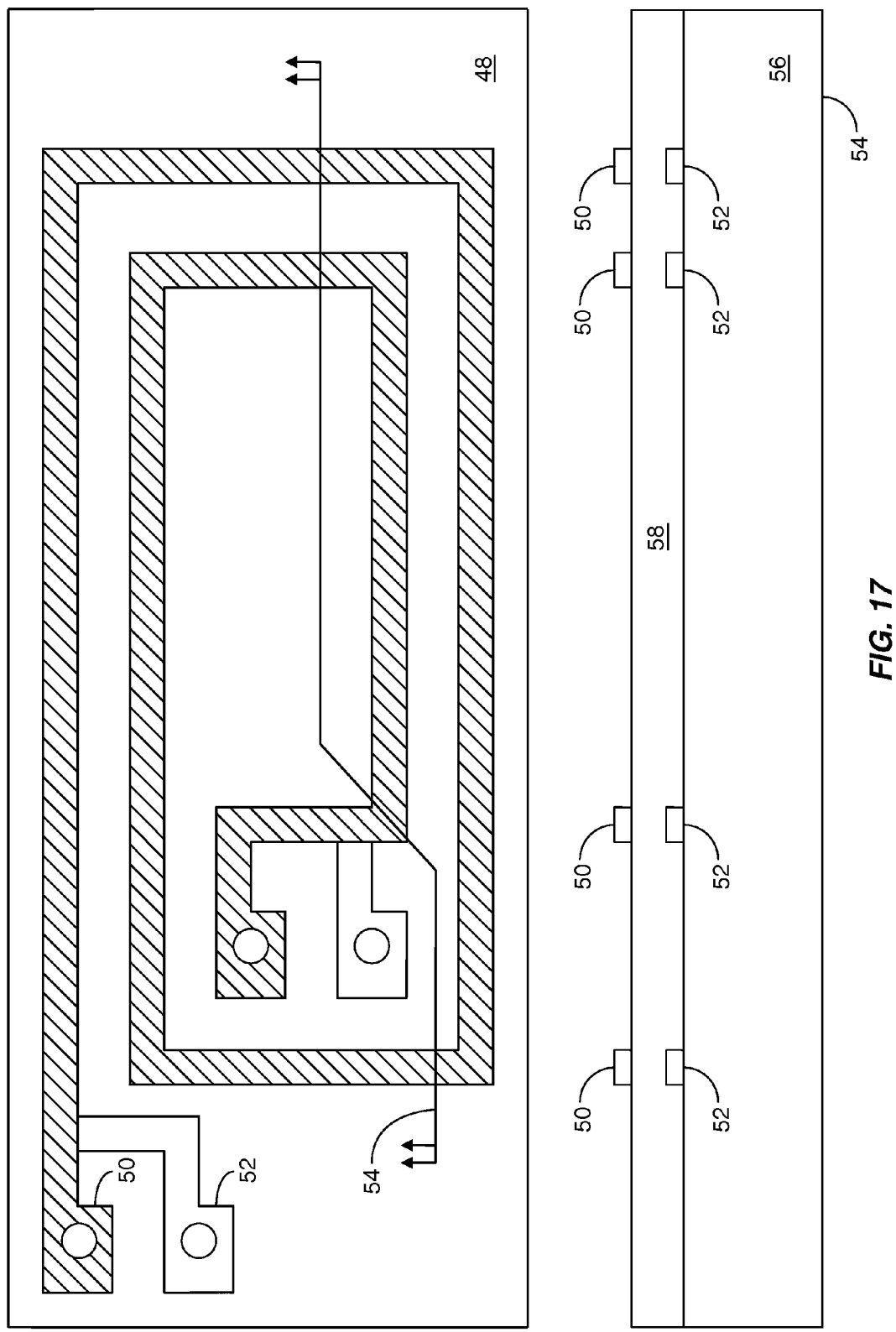
FIG. 17 shows one embodiment of the coupled inductor network illustrated in FIG. 16.

FIG. 17 shows one embodiment of the coupled inductor network 48 illustrated in FIG. 16. The coupled inductor network 48 is formed on a semiconductor die. An upper metal layer 50 forms a coiled inductor. A lower metal layer 52 forms a coiled inductor that is approximately equivalent to the coiled inductor of the upper metal layer 50. Both inductors are aligned one above the other to share their respective magnetic fields. A cross section 54 of the semiconductor die shows the metal layers 50, 52, a semiconductor substrate 56, and a dielectric layer 58 to electrically insulate the metal layers 50, 52 from each other. In an alternate embodiment of the present invention, the coupled inductor network 48 may be implemented using any number of different layouts other than the coiled inductor illustrated in FIG. 17, including a straight line, a spiral, or a loop.

Figure 18:
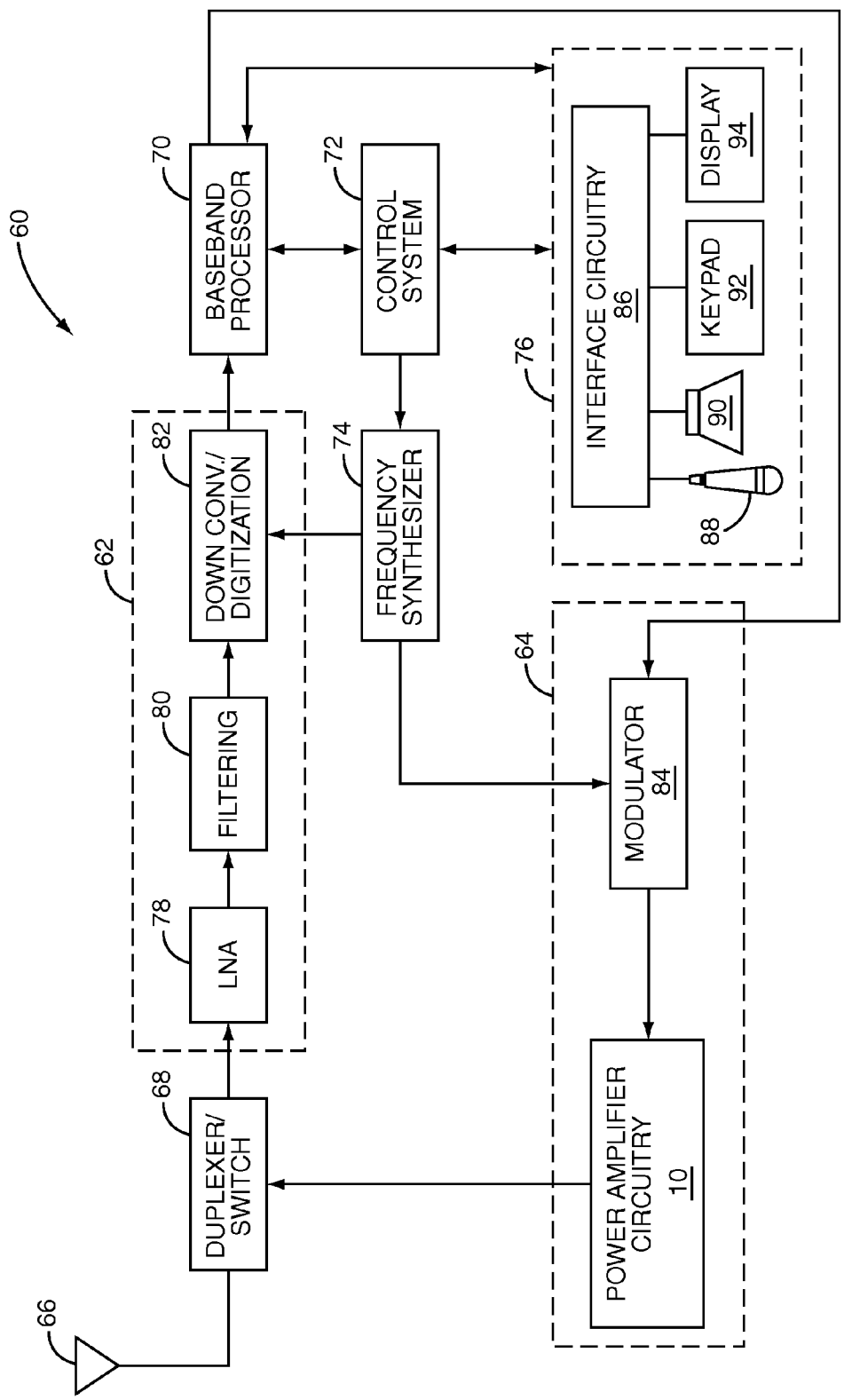
FIG. 18 shows an application example of the present invention used in a mobile terminal.

An application example of a quadrature RF amplifier output network 14 is its use in power amplifier circuitry 10 in a mobile terminal 60. The basic architecture of the mobile terminal 60 is represented in FIG. 18 and may include a receiver front end 62, a radio frequency transmitter section 64, an antenna 66, a duplexer or switch 68, a baseband processor 70, a control system 72, a frequency synthesizer 74, and an interface 76. The receiver front end 62 receives information bearing radio frequency signals from one or more remote transmitters provided by a base station. A low noise amplifier (LNA) 78 amplifies the signal. A filter circuit 80 minimizes broadband interference in the received signal, while down conversion and digitization circuitry 82 down converts the filtered, received signal to an intermediate or baseband frequency signal, which is then digitized into one or more digital streams. The receiver front end 62 typically uses one or more mixing frequencies generated by the frequency synthesizer 74. The baseband processor 70 processes the digitized received signal to extract the information or data bits conveyed in the received signal. This processing typically comprises demodulation, decoding, and error correction operations. As such, the baseband processor 70 is generally implemented in one or more digital signal processors (DSPs).

On the transmit side, the baseband processor 70 receives digitized data, which may represent voice, data, or control information, from the control system 72, which it encodes for transmission. The encoded data is output to the transmitter 64, where it is used by a modulator 84 to modulate a carrier signal that is at a desired transmit frequency. The power amplifier circuitry 10 amplifies the modulated carrier signal to a level appropriate for transmission, and delivers the amplified and modulated carrier signal to the antenna 66 through the duplexer or switch 68.

A user may interact with the mobile terminal 60 via the interface 76, which may include interface circuitry 86 associated with a microphone 88, a speaker 90, a keypad 92, and a display 94. The interface circuitry 86 typically includes analog-to-digital converters, digital-to-analog converters, amplifiers, and the like. Additionally, it may include a voice encoder/decoder, in which case it may communicate directly with the baseband processor 70. The microphone 88 will typically convert audio input, such as the user's voice, into an electrical signal, which is then digitized and passed directly or indirectly to the baseband processor 70. Audio information encoded in the received signal is recovered by the baseband processor 70, and converted by the interface circuitry 86 into an analog signal suitable for driving the speaker 90. The keypad 92 and display 94 enable the user to interact with the mobile terminal 60, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. Quadrature radio frequency (RF) amplifier circuitry comprising a quadrature RF amplifier output network comprising:
    a quadrature RF power combiner comprising:
        an in-phase RF input adapted to receive a first in-phase RF input signal, and having an in-phase input impedance based on a first impedance and impedance transformation circuitry;
        a quadrature-phase RF input adapted to receive a first quadrature-phase RF input signal, and having a quadrature-phase input impedance based on the first impedance and the impedance transformation circuitry;
        a combined RF output adapted to provide a first RF output signal based on the first in-phase RF input signal and the first quadrature-phase RF input signal; and
        an isolation RF output adapted to provide an isolation RF output signal based on the first in-phase RF input signal and the first quadrature-phase RF input signal;
    the impedance transformation circuitry comprising:
        an impedance transformation input adapted to receive the first RF output signal;
        an impedance transformation output adapted to provide a second RF output signal, wherein the first impedance is presented to the impedance transformation output; and
        a plurality of series coupled transformation stages coupled between the impedance transformation input and the impedance transformation output, such that each impedance transformation stage comprises:

a stage input;

a stage output;

a first stage inductive element coupled between the stage input and the stage output; and a stage capacitive element coupled between the stage output and a DC reference; and termination circuitry adapted to receive the isolation RF output signal.

2. The quadrature RF amplifier circuitry of claim 1 wherein the first quadrature-phase RF input signal comprises:

a first component that is phase-shifted approximately 90 degrees from and is of approximately equal amplitude to the first in-phase RF input signal; and a second component that is approximately a difference between the first quadrature-phase RF input signal and the first component, wherein the first component and the first in-phase RF input signal are phase-aligned and combined to provide the first RF output signal, and the isolation RF output signal is based on the second component.

3. The quadrature RF amplifier circuitry of claim 1 wherein:

the impedance transformation input has an impedance transformation input impedance based on the first impedance and the impedance transformation circuitry;

the termination circuitry provides a second impedance approximately equal to the impedance transformation input impedance; and the termination circuitry is coupled to the isolation RF output.

4. The quadrature RF amplifier circuitry of claim 1 wherein the termination circuitry comprises a resistive element.

5. The quadrature RF amplifier circuitry of claim 1 wherein the termination circuitry comprises an element that substantially blocks direct current (DC) current coupled in series with a resistive element.

6. The quadrature RF amplifier circuitry of claim 5 wherein the element that substantially blocks DC current comprises a capacitive element.

7. The quadrature RF amplifier circuitry of claim 6 wherein the termination circuitry further comprises an inductive element coupled in series with the capacitive element.

8. The quadrature RF amplifier circuitry of claim 7 wherein an inductive reactance of the inductive element is approximately equal to a capacitive reactance of the capacitive element at an operating center frequency.

9. The quadrature RF amplifier circuitry of claim 1 further comprising a quadrature RF amplifier adapted to receive a second in-phase RF input signal and a second quadrature-phase RF input signal, the quadrature RF amplifier comprising:

an in-phase output transistor element adapted to provide the first in-phase RF input signal; and a quadrature-phase output transistor element adapted to provide the first quadrature-phase RF input signal, wherein an amplitude of the first in-phase RF input signal is approximately equal to an amplification factor times an amplitude of the second in-phase RF input signal, and an amplitude of the first quadrature-phase RF input signal is approximately equal to the amplification factor times an amplitude of the second quadrature-phase RF input signal.

10. The quadrature RF amplifier circuitry of claim 9 wherein a semiconductor die provides at least one element of the quadrature RF amplifier and provides at least one element of the quadrature RF amplifier output network.

11. The quadrature RF amplifier circuitry of claim 9 wherein a plurality of semiconductor dies mounted to a substrate provide at least one element of the quadrature RF amplifier and provide at least one element of the quadrature RF amplifier output network.

12. The quadrature RF amplifier circuitry of claim 9 wherein the in-phase output transistor element comprises a first bipolar transistor element, and the quadrature-phase output transistor element comprises a second bipolar transistor element.

13. The quadrature RF amplifier circuitry of claim 12 wherein the first bipolar transistor element comprises a first gallium arsenide (GaAs) heterojunction bipolar transistor (HBT) element, and the second bipolar transistor element comprises a second GaAs HBT element.

14. The quadrature RF amplifier circuitry of claim 9 wherein the in-phase output transistor element comprises a first field effect transistor (FET) element, and the quadrature-phase output transistor element comprises a second FET element.

15. The quadrature RF amplifier output network of claim 9 further comprising:

an in-phase RF blocking circuit coupled between a direct current (DC) supply and the in-phase output transistor element to provide DC power to the in-phase output transistor element, wherein the in-phase RF blocking circuit substantially blocks RF current; and a quadrature-phase RF blocking circuit coupled between the DC supply and the quadrature-phase output transistor element to provide DC power to the quadrature-phase output transistor element, wherein the quadrature-phase RF blocking circuit substantially blocks RF current.

16. The quadrature RF amplifier circuitry of claim 15 wherein the in-phase RF blocking circuit comprises an in-phase inductive element, and the quadrature-phase RF blocking circuit comprises a quadrature-phase inductive element.

17. The quadrature RF amplifier circuitry of claim 1 wherein the quadrature RF power combiner further comprises:

a first combiner inductive element coupled between the in-phase RF input and the isolation RF output;

a second combiner inductive element coupled between the quadrature-phase RF input and the combined RF output;

a first combiner capacitive element coupled between the in-phase RF input and the combined RF output; and a second combiner capacitive element coupled between the quadrature-phase RF input and the isolation RF output, wherein the first combiner inductive element is magnetically coupled to the second combiner inductive element.

18. The quadrature RF amplifier circuitry of claim 17 wherein a semiconductor die provides the first combiner inductive element and the second combiner inductive element.

19. The quadrature RF amplifier circuitry of claim 1 wherein the impedance transformation circuitry further comprises a blocking capacitive element coupled between the impedance transformation input and the impedance transformation output, wherein the blocking capacitive element substantially blocks DC current.

20. The quadrature RF amplifier circuitry of claim 1 wherein each impedance transformation stage further comprises a second stage inductive element coupled in series with the stage capacitive element, wherein the series coupled second stage inductive element and the stage capacitive element are coupled in series between the stage output and the reference node.

21. The quadrature RF amplifier circuitry of claim 20 wherein a capacitive reactance of the stage capacitive element is approximately equal to an inductive reactance of the second stage inductive element at a harmonic of an operating center frequency.

22. The quadrature RF amplifier circuitry of claim 1 wherein the DC reference is approximately ground.

* * * * *